United States Patent [19]

Morishita et al.

[11] Patent Number: 5,245,203
[45] Date of Patent: Sep. 14, 1993

[54] PHOTOELECTRIC CONVERTER WITH PLURAL REGIONS

[75] Inventors: Masakazu Morishita, Atsugi; Shin Kikuchi, Isehara, both of Japan

[73] Assignee: Canon Kabushiki Kaisha, Tokyo, Japan

[21] Appl. No.: 860,121

[22] Filed: Mar. 31, 1992

Related U.S. Application Data

[63] Continuation of Ser. No. 711,389, Jun. 6, 1991, abandoned, which is a continuation of Ser. No. 600,242, Oct. 22, 1990, abandoned, which is a continuation of Ser. No. 363,058, Jun. 6, 1989, abandoned.

[30] Foreign Application Priority Data

Jun. 6, 1988 [JP] Japan .................... 63-138871
Jul. 27, 1988 [JP] Japan .................... 63-185539
Jun. 2, 1989 [JP] Japan .................... 1-139264

[51] Int. Cl.$^5$ ............................. H01L 27/14
[52] U.S. Cl. .................... 257/113; 257/114; 257/435; 257/440; 257/462; 257/443
[58] Field of Search ........... 357/30 S, 30 G, 30 K, 357/30 P, 30 I, 30 L, 30 H, 30 R, 32, 58, 24 LR; 257/443, 435, 462, 440, 461, 446, 113, 114

[56] References Cited

U.S. PATENT DOCUMENTS

| | | | |
|---|---|---|---|
| 4,407,010 | 9/1983 | Baji et al. | 357/30 H X |
| 4,665,422 | 5/1987 | Hirao et al. | 357/30 P |
| 4,682,203 | 7/1987 | Konda | 357/30 P X |
| 4,737,832 | 4/1989 | Kyuma | 357/30 P |

FOREIGN PATENT DOCUMENTS

| | | | |
|---|---|---|---|
| 0038474 | 10/1981 | Japan | 357/30 H |
| 57-75469 | 5/1982 | Japan | 357/30 G |
| 2144265 | 2/1985 | United Kingdom | 357/30 H |

OTHER PUBLICATIONS

Ohba et al, "MOS Area Sensor: Part II–Low Noise MOS Area Sensor with Antiblooming Photodiodes," *IEEE Transactions on Electron Devices*, vol. ED-27, No. 8, Aug. 1980, pp. 1682-1687.

Primary Examiner—William Mintel
Attorney, Agent, or Firm—Fitzpatrick, Cella, Harper & Scinto

[57] ABSTRACT

A photoelectric converter of semiconductor transistor comprises two semiconductor regions of same electroconductive type and a semiconductor region of opposite electroconductive type to that of the two semiconductor regions. The semiconductor region of opposite electroconductive type is irradiated with a light. An amplified power is output from at least one of the two semiconductor regions of same electroconductive type. The semiconductor region of the opposite electroconductive type comprises a semiconductor region that accumulates a charge generated by light input and a semiconductor region acting as a control electrode region for the semiconductor transistor.

21 Claims, 15 Drawing Sheets

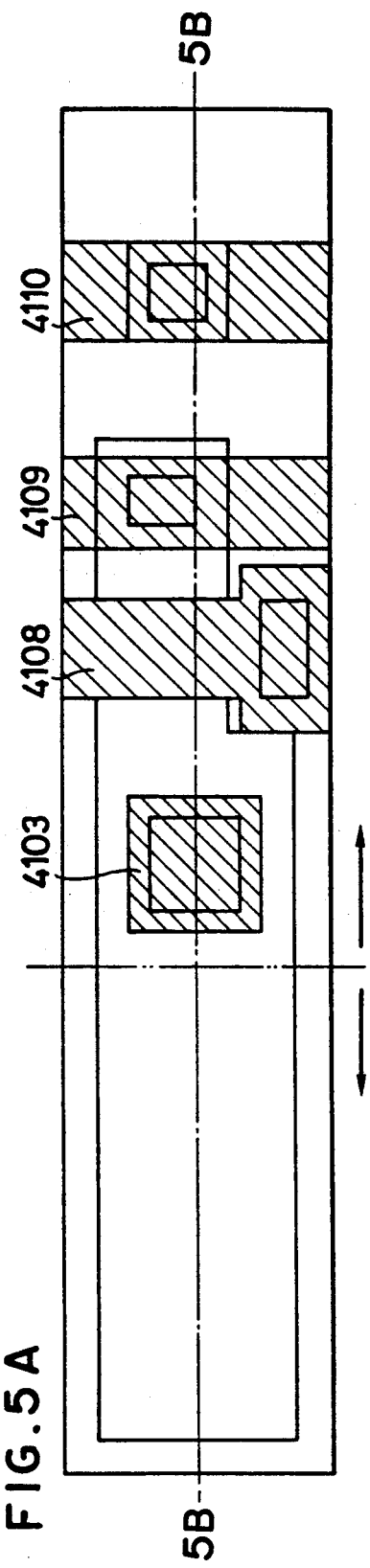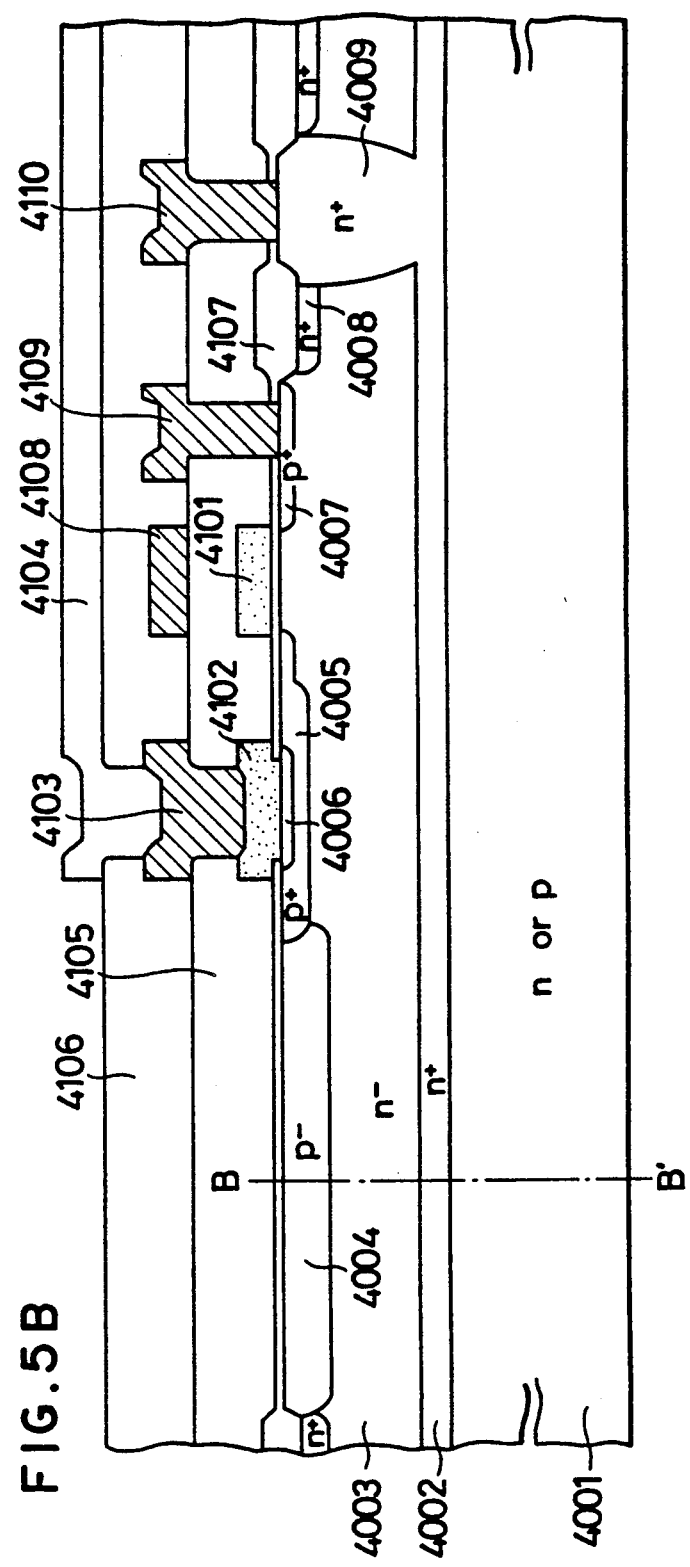
FIG. 5A
FIG. 5B

PHOTOELECTRIC CONVERTER WITH PLURAL REGIONS

This application is continuation of application Ser. No. 07/711,389 filed Jun. 6, 1991 now abandoned, which is a continuation application of Ser. No. 07/600,242 filed Oct. 22, 1990, now abandoned, which is a continuation application of Ser. No. 07/363,058 filed Jun. 6, 1989, now abandoned.

BACKGROUND OF THE INVENTION

1. Field of the Invention

This invention relates to a photoelectric converter and more particularly to a photoelectric converter capable of amplifying a photoelectrically converted power, which comprises a light-receiving section and a light-shielding section, or a photoelectric converter of a semiconductor transistor, which comprises two semiconductor regions of same electroconductive type and a semiconductor region of opposite electroconductive type to that of the two semiconductor regions, where the semiconductor region of opposite electroconductive type is irradiated with light and an amplified power is output from at least one of the two semiconductor regions of same electroconductive type.

2. Related Background Art

A photoelectric converter which accumulates a charge generated by light irradiation and outputs an amplified power corresponding to the accumulated charge is one type of photoelectric converters for use in a picture reading device in a facsimile machine, a copying machine, etc. One particular type of such photoelectric converters is a photoelectric converter which accumulates carriers (holes) in a base region of a phototransistor by light irradiation of the base region and outputs an amplified electric current from an emitter region, where the base region of the phototransistor is formed as a light-receiving section and the emitter region as a light-shielding section. A photoelectric converter using a phototransistor can amplify carriers in the light-receiving region, increase sensitivity, reduce random noise and increase S/N ratio, as compared with a photoelectric converter using a photodiode and having no function to amplify a photoelectric current.

FIG. 1 is a schematic cross-sectional view of a conventional photoelectric converter, where numeral 1013 is an n-type layer functioning as a collector of a phototransistor, 1003 is an n-epitaxial layer functioning, 1005 is a p layer as a base region of the phototransistor, 1006 is an n layer functioning as an emitter region of the phototransistor, 1007-2 is an emitter electrode made of Al, etc., 1008 is a LOCOS oxide film, L is a light-receiving section and D is a light-shielding section.

When such photoelectric converters are used in a color line sensor 1101, as shown in FIG. 2, three line sensors are provided for red (R), green (G) and blue (B), where each line sensor comprises a light-shielding section 1011 and a light-receiving section 1012. The length of the light-shielding section 1011 and that of the light-receiving section 1012 in the line sensor arrangement direction, i.e., direction A in FIG. 2, are n bits and one bit, respectively. One bit corresponds to the light-receiving section of one sensor cell and is in a rectangular shape, whose one side is, for example, 10 μm long.

The respective line sensors corresponding to R, G and B are positionally different from one another, and thus when a signal R is obtained at a given line of a draft, a signal G is a signal at a position of the (n+2)th line from the given line and a signal B is a signal at a position of the (2n+3)th line from the given line. In order to obtain signals R, G and R at the same position of the draft, at least the previously output signals G and B must be stored in an external memory 102 through the respective sample hold circuits (S/H) 1014 and A/D conversion circuits 1015 among the signals R, G and B.

Such photoelectric converters are disclosed, for example, in Laid-Open European Patent Application No. 0132076.

FIG. 3A is a schematic plan view showing the structure of a photoelectric converter in detail and FIG. 38 is a schematic cross-sectional view showing the line A—A' of FIG. 3A, where photoelectric converter cells are arranged on an n silicon substrate 3201, and each cell is electrically insulated from the adjacent cells through device-separating regions 3202 comprising $SiO_2$, $Si_3N_4$, polysilicon or the like. Each cell has the following structure. A p base region 3204 and a p region 3205 are formed on an n$^-$ region 3203 with a low impurity concentration, formed by an epitaxial technique, etc., through doping with p-type impurity such as boron, etc., and an n$^+$ emitter region 3206 is formed on the p base region 3204. The p base region 3204 and the p region 3205 also act as a source and a drain of a p channel MOS transistor as will be described later.

An oxide film 3207 is formed on the n$^-$ region 3203 having the thus formed subregions, and a gate electrode 3209 and a capacitor electrode 3208 of the MOS transistor are formed on the oxide film 3207. The capacitor electrode 3209 is counterposed to the p base region 3204 through the oxide film 3207 to form a capacitor for controlling the base potential.

In addition, an emitter electrode 3210 connected to the n$^+$ emitter region 3206 and an electrode 3211 connected to the p region 3205 are further formed, and a collector electrode 3212 is formed on the back side of the substrate 3201 through an ohmic contact layer.

The operations of the photoelectric converter cell will be described below. Light is input into the photoelectric converter cell from the side of the p base region 3204 and carriers (in this case holes) are accumulated in the p base region 3204 in an amount corresponding to the light quantity (accumulation operation).

The base potential changes with the accumulated carriers and an electrical signal corresponding to the input light quantity is read out by reading the potential change through the emitter electrode 3210 (reading operation).

A refresh operation to remove the holes accumulated in the p base region 3204 will be described below.

FIGS. 4A and 4B show potential wave forms for explaining the respective refresh operation. As shown in FIG. 4A, an MOS transistor is brought into an ON state only when a negative potential higher than the threshold value is applied to the gate electrode 3208. As shown in FIG. 4B, the emitter electrode 3210 is earthed and the electrode 3211 is brought to an earth potential to carry out the refresh operation. Then, a negative potential is applied to the gate electrode 3208 at first to put the p channel MOS transistor in an ON state, whereby the potential of p base region 3204 can be kept at a constant value, irrespective of the accumulated potential level. Then, a positive potential pulse for refresh operation is applied to the capacitor electrode 3209, whereby the p base region 3204 is biased in the forward direction to the n$^+$ emitter region 3206 and the accumulated holes are removed through the earthed emitter electrode 3210. At the time of rising of the refresh pulse, the p base region 3204 is returned to the initial state of negative potential (refresh operation). After the potential of the p base region 3204 is made constant by the MOS transistor, the residual charge is erased by the application of the refresh pulse in this manner, and thus a fresh accumulation operation can be carried out again, independently of the previously accumulated potential. Furthermore, the residual charge can be rapidly erased and thus a high speed operation can be carried out. Thereafter, the accumulation operation, reading operation and refresh operation are likewise repeated.

The potential Vp generated in the base by the holes accumulated in the base by photoexcitation can be given by the following formula:

$$Vp = Q/C$$

where Q is a charge amount of holes accumulated in the base and C is a capacitance connected to the base. As is obvious from the formula, a high level of integration can reduce the cell size and also reduce both Q and C, and thus the potential Vp generated by photoexcitation can be kept substantially constant. Thus, the system proposed above is also advantageous for higher resolution. However, a higher blue sensitivity and a higher response speed of the semiconductor transistor have been sometimes required for the foregoing photoelectric converter and thus a further improvement of the characteristics has been desired.

When a picture treatment is carried out with the color line sensor 1101 as explained, referring to FIGS. 1 and 2, a higher capacity of the external memory than a given one is required for storing the previously output signals G and B in the external memory so as to obtain signals R, G and B at the same position of a draft, and a reduction of the necessary memory capacity has been desired on account of cost reduction, etc. Furthermore, there has been a problem of difficult optimization in the base region of a phototransistor because the optimum conditions of the size, impurity concentrations, etc. in the photoelectric conversion region are different from those for a bipolar transistor, and a further improvement thereof has been also desired.

SUMMARY OF THE INVENTION

An object of the present invention is to provide a photoelectric converter of higher sensitivity, particularly higher blue sensitivity, capable of high speed response to an input signal.

Another object of the present invention is to provide a photoelectric converter capable of optimizing a sensor section and a switching section and more particularly optimizing the optimum conditions in the base region of a phototransistor and those for a bipolar transistor.

Another object of the present invention is to provide a photoelectric converter with an enhanced degree of freedom in system design and optical design and with design simplification.

Still another object of the present invention is to provide a photoelectric converter of semiconductor transistor, which comprises two semiconductor regions of same electroconductive type and a semiconductor region of opposite electroconductive type to that of the two semiconductor regions, where the semiconductor region of opposite electroconductive type is irradiated with light and an amplified power is output from at least one of the two semiconductor regions of same electroconductive type, and the semiconductor region of the opposite electroconductive type comprises a semiconductor region that accumulates a charge generated by light input and a semiconductor region acting as a control electrode region for the semiconductor transistor.

A further object of the present invention is to provide a photoelectric converter capable of amplifying a photoelectrically converted power, which comprises a light-receiving section and a light-shielding section, a photoelectric conversion part being formed in the light-receiving section, an amplifying part being formed in the light-shielding section, the photoelectric conversion part being connected to an input region of the amplifying part through a wiring, and the light-receiving section being formed separate from the light-shielding section at a predetermined distance.

A still further object of the present invention is to provide a photoelectric converter which comprises a first semiconductor region of first electroconductive type, a second semiconductor region of first electroconductive type provided on the first semiconductor region, a third semiconductor region of second electroconductive type provided in contact with the second semiconductor region, a fourth semiconductor region of second electroconductive type provided in contact with the third semiconductor region and the second semiconductor region, a fifth semiconductor region of first electroconductive type provided in contact with the fourth semiconductor region, and a sixth semiconductor region of second electroconductive type provided in contact with the second semiconductor region, the third semiconductor region being destined to be a light input region and the first, second, fourth and fifth semiconductor regions and the second, fourth and sixth semiconductor regions being destined to elements constituting transistors, respectively.

A still further object of the present invention is to provide a photoelectric converter which comprises a first semiconductor region of first electroconductive type, a second semiconductor region of the first electroconductive type provided in contact with the first semiconductor region, a third semiconductor region of a second electroconductive type provided in contact with the second semiconductor region, a fourth semiconductor region of the second electroconductive type electrically connected to the third semiconductor region through an electroconductive material and provided in contact with the second semiconductor region and a fifth semiconductor region of the first electroconductive type provided in contact with the fourth semiconductor region, the third semiconductor region being destined to be a light input region and the first, second, fourth and fifth semiconductor regions are destined to be an element constituting a transistor.

BRIEF DESCRIPTION OF THE DRAWINGS

FIGS. 5A and 5B are schematic structural views explaining a photoelectric converter according to a first embodiment of the present invention, where FIG. 5A is a schematic plan view and FIG. 5B is a schematic cross-sectional view along the line A—A' of FIG. 5A.

DETAILED DESCRIPTION OF THE PREFERRED EMBODIMENTS

Figure 1:
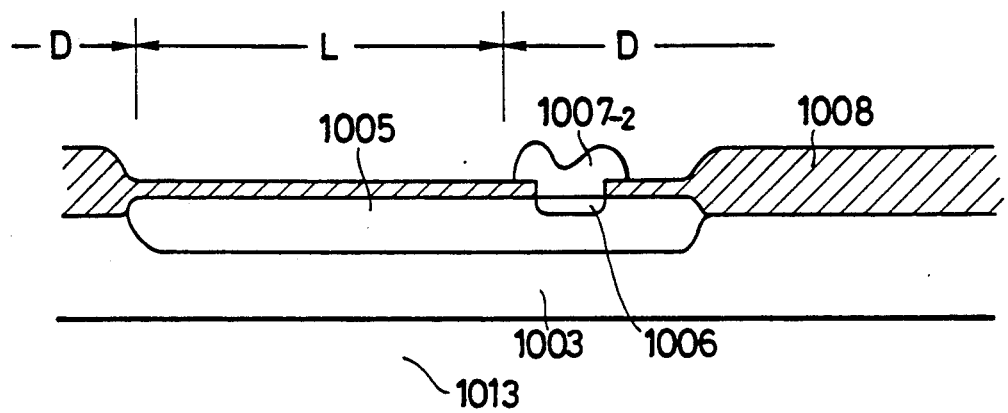
FIG. 1 is a schematic cross-sectional view explaining the structure of a conventional photoelectric converter.

In the present photoelectric converter capable of attaining the foregoing objects, a semiconductor region of opposite electroconductive type is divided into a semiconductor region that accumulates a charge generated by light input and a semiconductor region that serves as a control electrode region of a semiconductor conductor transistor, whereby the preparation conditions such as impurity concentration, thickness, etc. of the semiconductor region that accumulates a charge generated by light input and the preparation conditions such as impurity concentration, impurity concentration distribution, thickness, etc. in the semiconductor region acting as a semiconductor transistor control electrode region can be optimized in the respective semiconductor regions, as desired.

Furthermore, in the present photoelectric converter capable of attaining the foregoing objects, a photoelectric conversion part is formed in the light-receiving section, an amplifying part is formed in the light-shielding section, the photoelectric conversion part is connected to an input region of the amplifying part by a wiring, and the light-receiving section is provided separate from the light-shielding section at a predetermined distance, whereby the present photoelectric converter can be provided with an amplifying function and the light-receiving sections can be formed adjacent to each other, while providing the light-receiving sections separate from the light-shielding sections.

The present invention will be described in detail below, referring to the following embodiments and drawings.

FIGS. 5A and 5B are schematic structural views explaining a photoelectric converter according to the first embodiment of the present invention, where FIG. 5A is a schematic plan view of a photoelectric converter cell and FIG. 5B is a schematic vertical cross-sectional view along the line A—A' of FIG. 5A.

As shown in FIGS. 5A and 5B, the photoelectric converter cell comprises a silicon substrate 4001, doped with an atom of Periodic Table Group V, such as phosphorous (P), antimony (Sb), arsenic (As), etc. as an impurity to make the substrate n-type, or a silicon substrate 4001, doped with an atom of Periodic Table, Group III, such as boron (B), aluminum (Al), etc. as an impurity to make the substrate p-type, an embedded region (n+) 4002 formed on the substrate 4001, an n$^-$ region 4003 with a low impurity concentration formed on the embedded region 4002 by epitaxial technique, etc., a p$^-$ region 4004 of a light-receiving section, doped with an impurity such as boron (B), etc. formed on the n$^-$ region 4003 by impurity diffusion, ion diffusion, epitaxial technique, etc., a p+ region 4005 as a base for a bipolar transistor and as a source for an MOS transistor, formed by the same technique as used for forming the p$^-$ region 4004, an n region in the p+ region 4005, a p+ region 4007 as a drain for an MOS transistor, an n+ region 4008 as a channel stop, an n+ region 4009 for lowering the collector resistance of bipolar transistor, an electrode 4101 of polysilicon, a metal, etc. as a gate for the MOS transistor, an electrode wiring 4108 connected to the electrode 4101, electrode wiring 4102, 4103, and 4104 of polysilicon, a metal, etc. connected to the emitter for bipolar transistor, an electrode wiring 4109 connected to the drain for MOS transistor, an electrode wiring 4110 connected to the n+ region 4009, and insulating films 4105, 4106, and 4107 for separating the electrodes, wiring and devices from one another.

For simplification, the insulating films 4105, 4106 and 4107 and the electrode wiring are omitted in FIG. 5A.

Working of the present photoelectric converter will be described below.

Figure 6A:
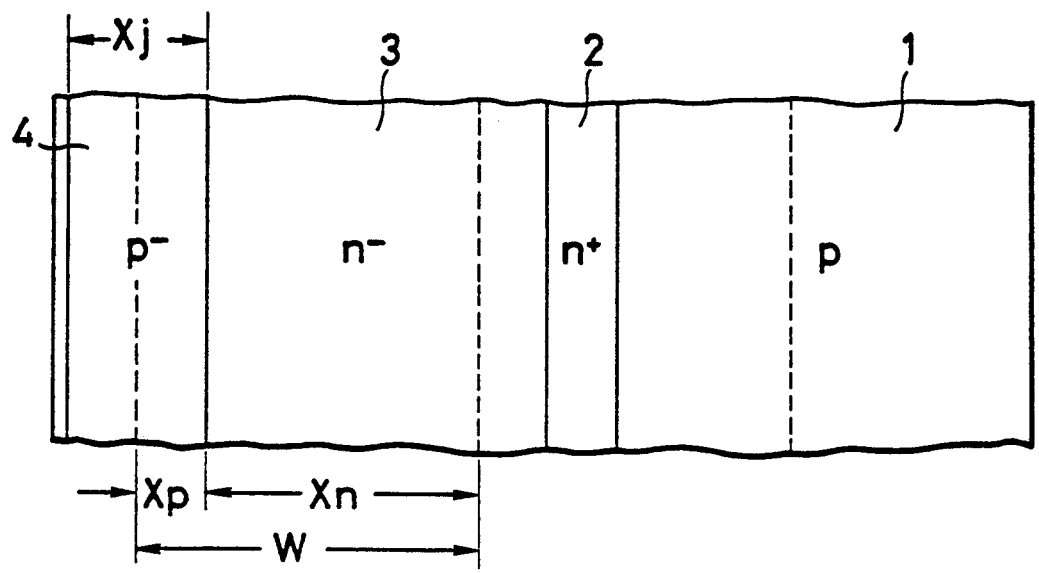
FIG. 6A is a schematic, enlarged view when cut away along the line B—B' of FIG. 5B.
Figure 6B:
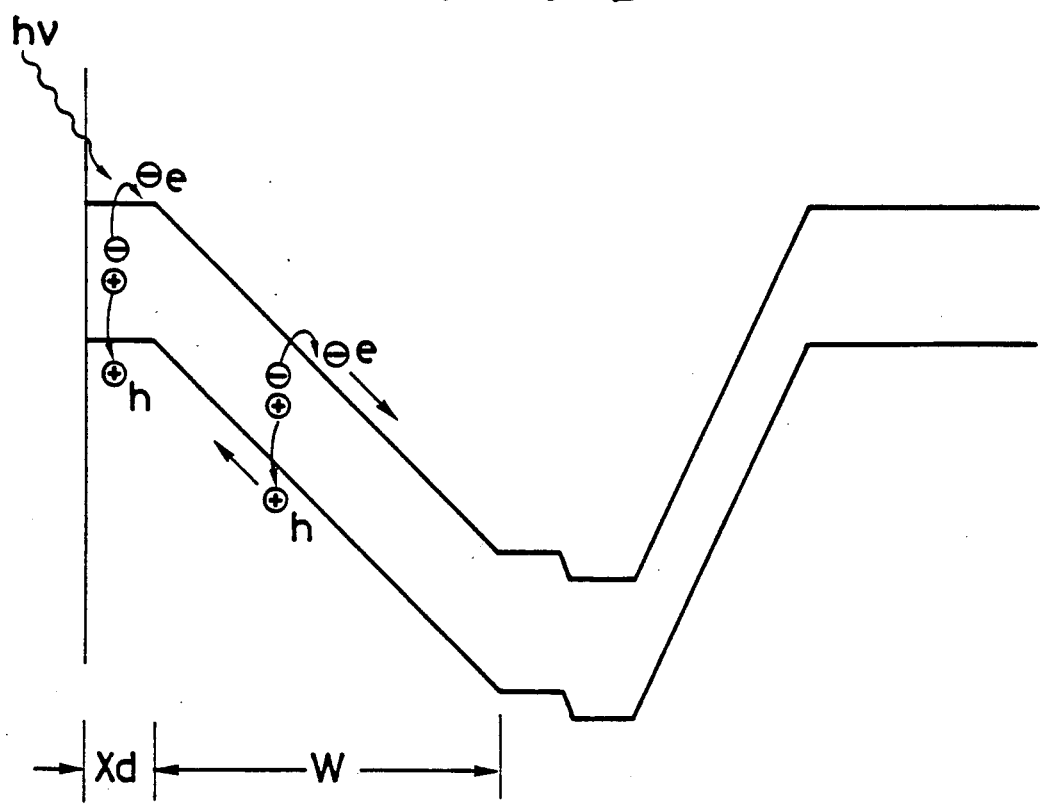
FIG. 6B is a potential profile in the depth direction of FIG. 6A.

FIG. 6A is a schematic enlarged cross-sectional view along the line B—B' of FIG. 5B and FIG. 6B view along the is a potential diagram in the depth direction of FIG. 6A, i.e. the lateral direction of FIG. 6A.

In FIG. 6A, W is a depletion layer thickness, Xp and Xn are depletion layer thickness in the p$^-$region 4 and the n$^-$ region 3, respectively, and Xj is a depth of p$^-$ region 4.

In FIG. 6B, W is a depletion layer thickness and Xd is a neutral region 4 thickness in the p$^-$ region.

When light absorption takes place in the depletion layer (wherein the depletion layer thickness W), electrons and holes thus formed more rapidly migrate by drift without any recombination thereof, and thus a higher photosensitivity can be maintained. When light absorption takes place in the neutral region (within the neutral region thickness Xd) on the other hand, the thus formed electrons migrate by diffusion and recombine with holes, and thus the photosensitivity is lowered. Thus, it is preferable that in the light-receiving section the neutral region is smaller on the surface. However, when the surface is depleted, carriers are formed on the boundary between the semiconductor and the insulating layer, irrespective of light input, producing a noise. Thus, it is preferable that the surface is in a neutral region.

Figure 7:
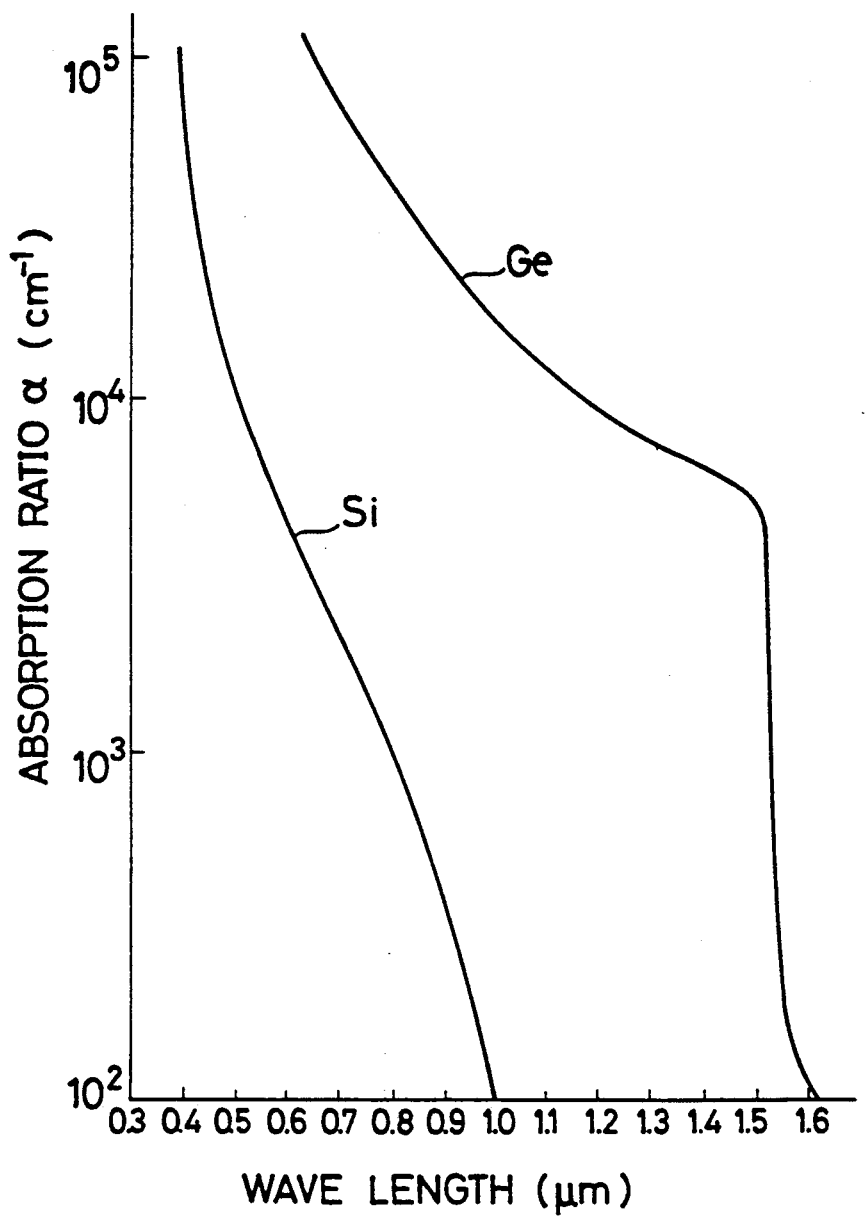
FIG. 7 is a characteristic diagram explaining the absorption ratio of Si and Ge to the light wavelength.

FIG. 7 is a characteristic diagram explaining an absorption ratio of Si or Ge to the light wavelength. As shown in FIG. 7, an absorption ratio of Si or Ge in larger with a shorter wavelength. In case of Si, the absorption ratio is up to $2 \times 10^4 cm^{-1}$ for the blue color ($\lambda=0.45$ μm), up to $7.5 \times 10^3 cm^{-1}$ for the green color ($\lambda=0.53$ μm), and up to $3 \times 10^3 cm^{-1}$ for the red color ($\lambda=0.65$ μm). When the colors allow for a half-width of about 0.05 μm, the light absorption in Si can be thoroughly carried out in depth of up to 1 μm for the blue color, up to 2 μm for the green color and up be 5 μm for the red color. Thus, the blue color is most influenced with the neutral region thickness Xd on the semiconductor surface, and the sensitivity is lowered, depending upon the thickness.

The depletion layer width can be given by the following equation.

$$W = \sqrt{\frac{2\epsilon S}{q} \frac{NA + ND}{NA\,ND} (Vbi + VR)} \quad (1)$$

$$Vbi = \frac{kT}{q} \ln \frac{NA\,ND}{ni^2} \quad (2)$$

$$Xp = \frac{ND}{NA + ND} W \quad (3)$$

where
W: depletion layer thickness;
Xp: p⁻ region depletion layer thickness;
NA: p⁻ region impurity concentration;
ND: n⁻ region impurity concentration;
εS: dielectric constant;
ni: true carrier concentration;
VR: reverse bias potential.

Figure 8:
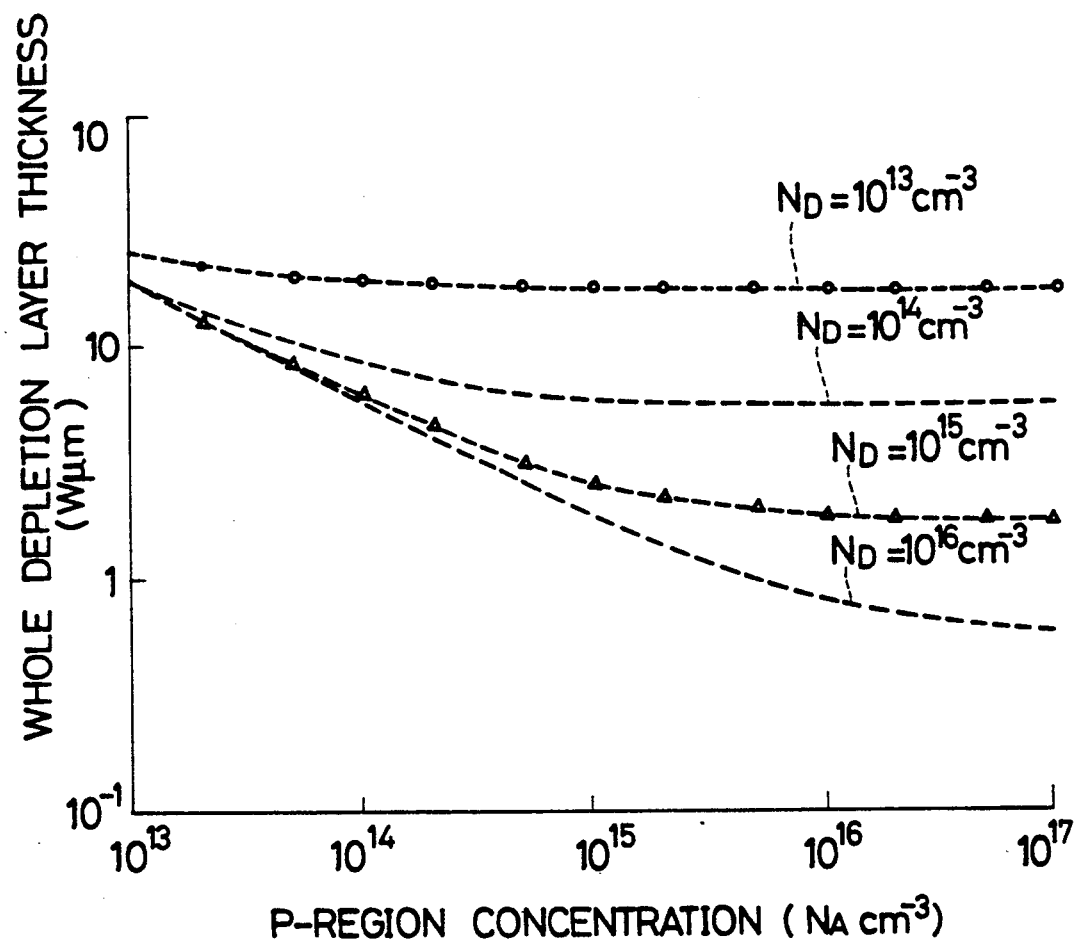
FIG. 8 is a characteristic diagram explaining a relationship between p-region concentration NA and whole depletion layer thickness Xp at a reverse bias potential VR=5V.

FIG. 8 is a characteristic diagram showing a relationship between the p⁻ impurity concentration NA and the whole depletion layer thickness W at a reverse bias potential of VR=SV. In FIG. 8, the axis of abscissa shows a p⁻ impurity concentration NA, the axis of ordinate shows a whole depletion layer thickness W and parameters show n⁻ region impurity concentrations ND. For example, in order to efficiently detect all of blue, green and red colors, a whole depletion layer thickness of about 5 μm is required. In that case, it is obvious from FIG. 8 that ND must be less than $2 \times 10^{14}$ cm⁻³.

Spectrosensitivity of the photoelectric converter can be approximately shown by the following equation.

$$S(\lambda) = \frac{\lambda}{1.24} \exp(-\alpha Xd) \times (1 - \exp(-\alpha W)) \cdot T[A/W] \quad (4)$$

where
λ: light wavelength;
α: light absorption ratio (cm⁻¹),
Xd: non-sensitive region (neutral region);
W: high sensitivity region (depletion layer thickness);
T: ratio of light quantity input inks the transistor (transmissivity).

As is obvious from the foregoing equation (4), the sensitivity is sharply influenced with the thickness of Xd, and thus a smaller thickness is preferable for Xd. Furthermore, the sensitivity is dependent upon the wavelength, and the blue color is lower in the sensitivity than the red color. In order to correct the relative spectrosensitivity, W is decreased. In this way, the sensitivity can be optimized.

As is readable from FIG. 8, the sensitivity can be optimized by controlling the n⁻ region concentration. In order to increase the sensitivity for blue color, it is preferable to decrease the neutral region Xd.

Figure 9:
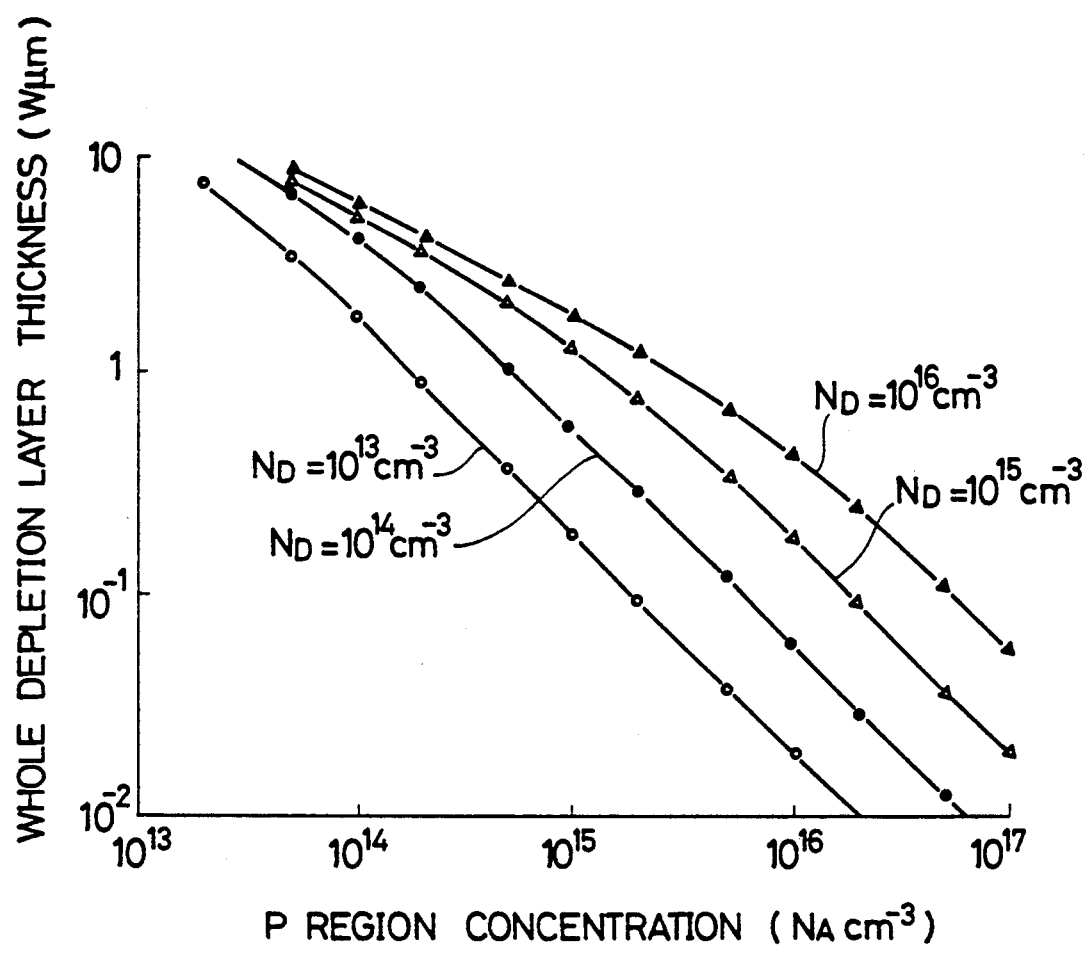
FIG. 9 is a characteristic diagram explaining a relationship between p-region concentration NA and p-layer depletion layer thickness Xp.

FIG. 9 is a characteristic diagram explaining a relationship between the p⁻ impurity concentration NA and the p-layer depletion layer thickness Xp, where the axis of abscissa shows a p⁻ impurity concentration NA, the axis of ordinate shows a p-layer depletion layer thickness Xp and parameters shows n-region impurity concentrations ND. In FIG. 9, when p-region NA is $10^{15} cm^{-3}$ at ND=$10^{14}$ cm⁻³, Xp is 0.6 μm.

When Xj of p⁻ region 4 is 0.7 μm, the non-sensitive region can have a thickness of 0.1 μm, and an optimization to increase the sensitivity for blue color can be made. By making an impurity concentration higher only in a region to a thickness of 0.1 μm from the surface and lower in a region over the thickness of 0.1 μm from the surface, the region over the thickness of 0.1 μm from the surface can be depleted.

In the present invention, the p⁻ region of the light-receiving section that accumulates the charge generated by light input is provided separate from the p⁺ region that acts as a base region for a bipolar transistor, whereby the light-receiving surface can be made to maintain a neutral region and the deeper region than the surface neighborhood can be depleted. The whole depletion layer thickness can be selected to conform to the spectrosensitivity requirements, and the n⁻ region concentration can be selected thereby.

Figure 10:
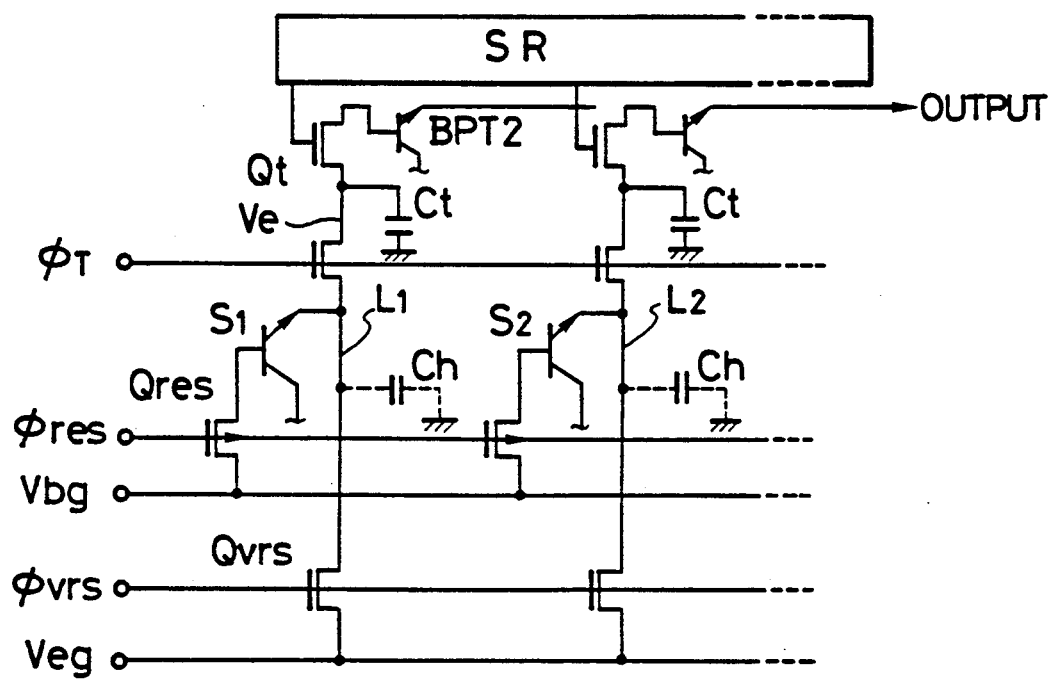
FIG. 10 is a schematic circuit diagram explaining one embodiment of the driving circuit of a photoelectric converter according to the present invention.

FIG. 10 is a schematic circuit diagram explaining one example of a driving circuit for the present photoelectric converter. In this example, a line sensor, where sensors S (S1, S2, ...) are arranged in a linear state, is illustrated. Each of the sensors S (S1, S2, ...) comprises a bipolar transistor and a reset transistor $Q_{res}$ connected to the base of the bipolar transistor. Carriers excited by light input are accumulated in the base of bipolar transistor, and read out at the emitter. By turning $Q_{res}$ on, the sensor is reset to a constant potential.

A pulse $\phi_{res}$ is input to the gate electrode at $Q_{res}$ of each of sensors S1, S2, ... for ON/OFF control, whereas a constant potential Vbg is applied to other main electrode of $Q_{res}$.

A constant positive potential is applied to the collector electrode of each of sensors S (S1, S2, ...), and the emitter electrodes are each connected to vertical lines L (L1, L2, ...).

A constant potential Veg is applied to each of vertical lines L (L1, L2, ...) through transistors $Q_{vrs}$ and a pulse $\phi_{res}$ is input to the gate electrode of $Q_{vrs}$ for ON/OFF control.

Furthermore, the respective vertical lines L (L1, L2, ...) are each connected to capacitors for accumulation, and signals are output from bipolar transistors BPT2 through transistors Qt.

The present photoelectric converter will be further described below, referring to further embodiments, where the same constituent members as shown in FIGS. 5A and 5B are identified with the same reference numerals and symbols as used in FIGS. 5A and 5B and their explanation is omitted.

Figure 11:
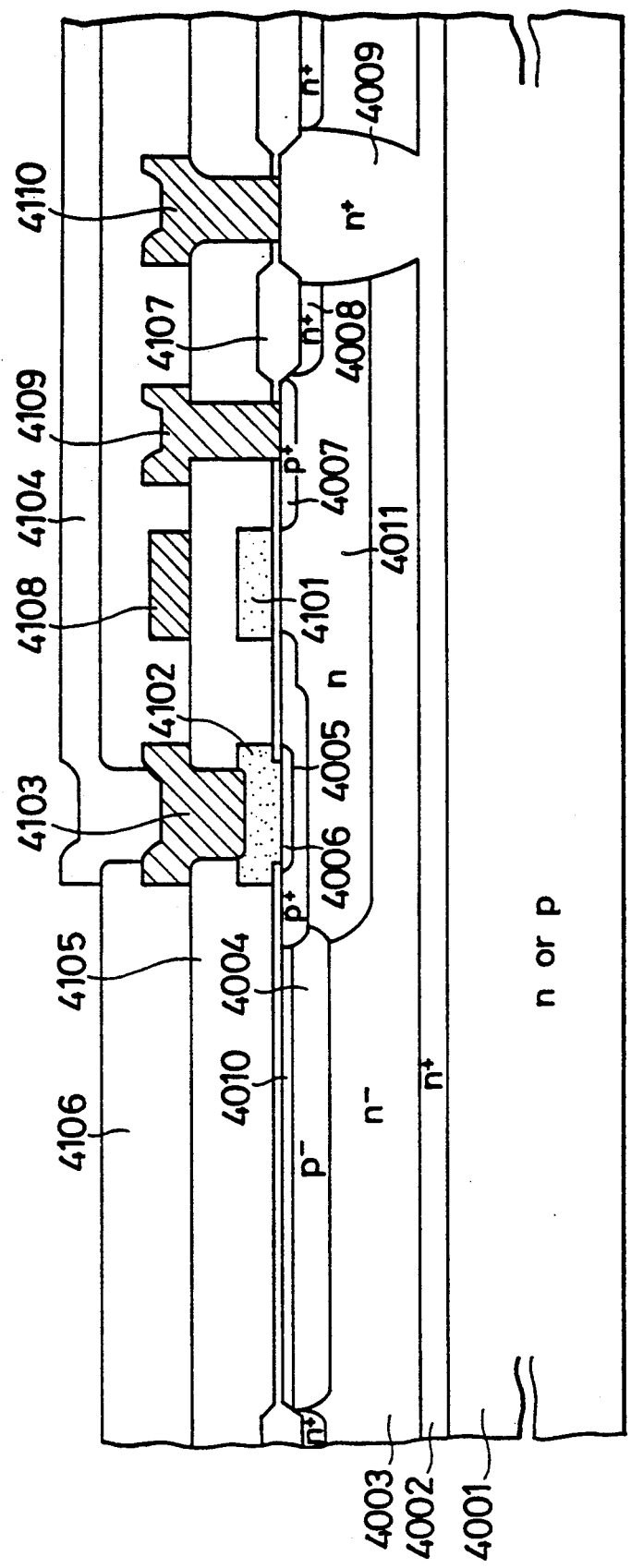
FIG. 11 is a schematic cross-sectional view explaining a photoelectric converter according to a second embodiment of the present invention.

FIG. 11 is a schematic cross-sectional view showing a photoelectric converter according to a second embodiment of the present invention, where a p+ region 4010 is provided only on the surface of the p− region 4004 as a light-receiving region and an n region 4011 of high impurity density is provided below the base of bipolar transistor to lower the collector resistance.

Figure 12:
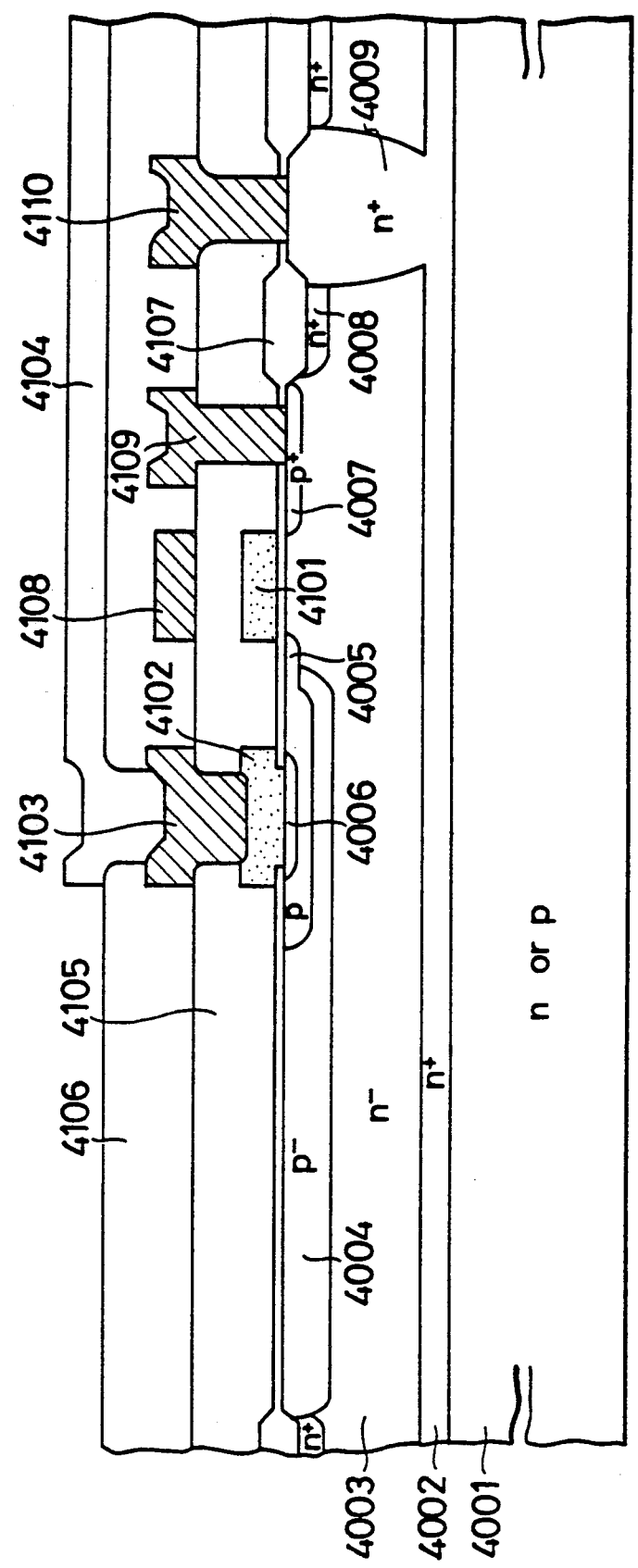
FIG. 12 is a schematic cross-sectional view explaining a photoelectric converter according to a third embodiment of the present invention.

FIG. 12 is a schematic cross-sectional view explaining a photoelectric converter according to a third embodiment of the present invention, where the p− region 4004 as a light-receiving region is extended under the emitter of bipolar transistor and the bipolar transistor is made in a drift base form to attain a high speed response. Needless to say, the bipolar transistor BPT2 at the output side, as shown in FIG. 10 can also take the same structure as mentioned above.

Figure 13:
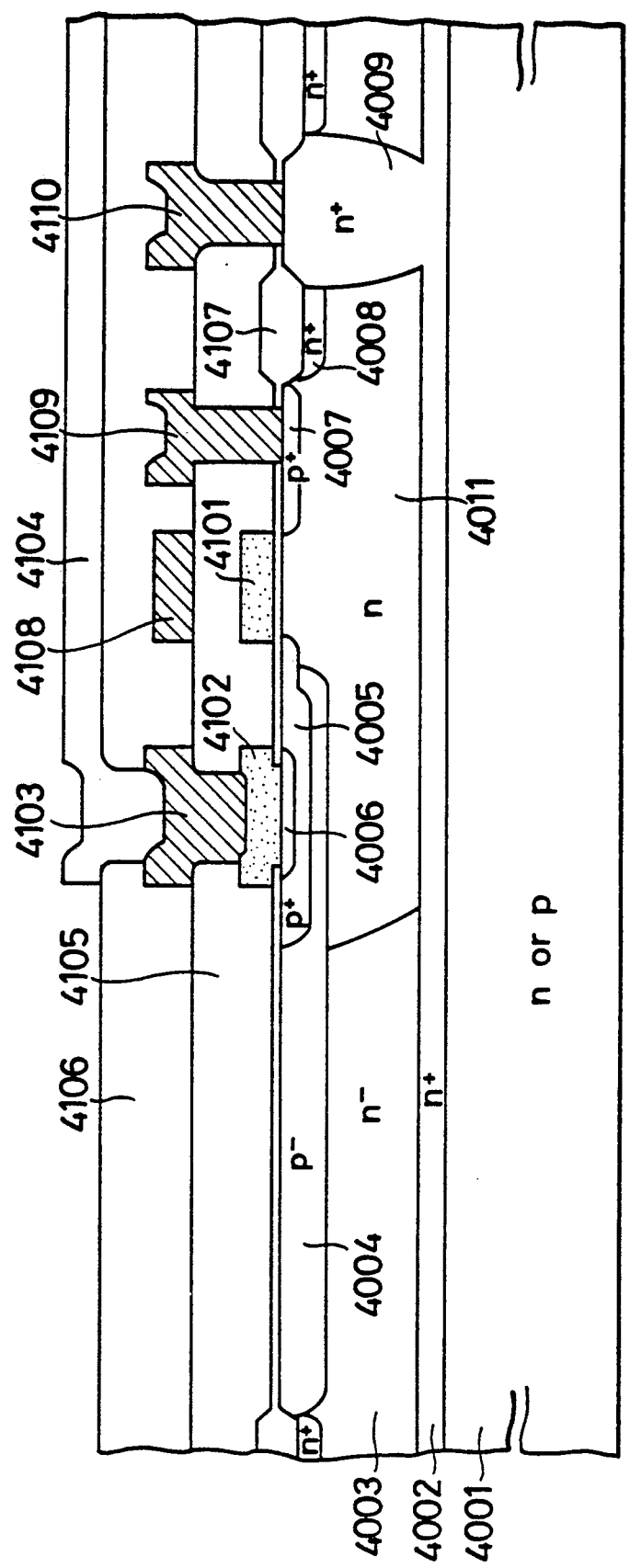
FIG. 13 is a schematic cross-sectional view explaining a photoelectric converter according to a fourth embodiment of the present invention.

FIG. 13 is a schematic cross-sectional view explaining a photoelectric converter according to a fourth embodiment of the present invention, where the n region 4011 is made thicker to reach the embedded region, thereby lowering the collector resistance.

Figure 14:
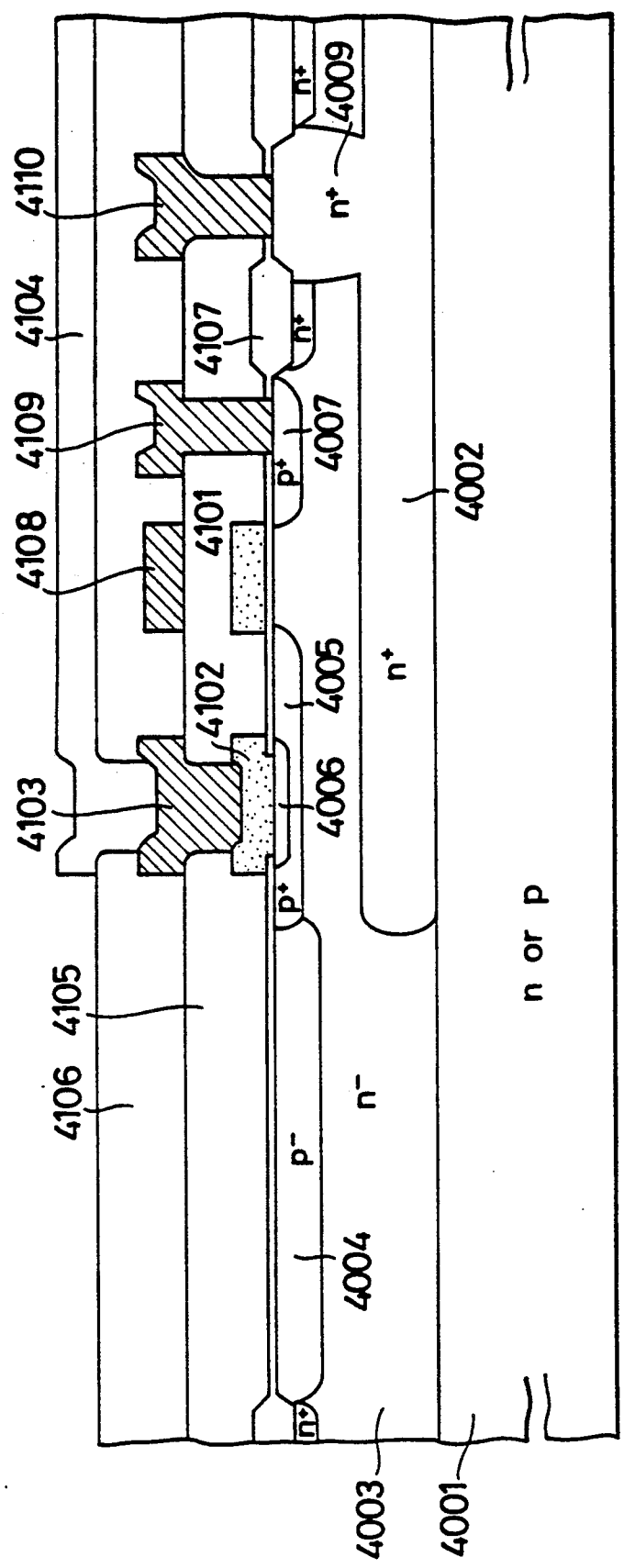
FIG. 14 is a schematic cross-sectional view explaining a photoelectric converter according to a fifth embodiment of the present invention.

FIG. 14 is a schematic cross-sectional view explaining a photoelectric converter according to a fifth embodiment of the present invention, where the embedded region is restricted only to the site for a bipolar transistor, etc. As shown in FIG. 14, no neutral region can be made to exist between the n− region of a light-receiving section and the p substrate by design, thereby eliminating a cause for carrier diffusion in the lateral direction between the sensor cells and also improving the smear and NTF.

In the foregoing embodiments, not only Si but also other semiconductor materials can be used and also an interchanged structure of all of n and p can be also used.

As shown in the foregoing embodiments, the transistor characteristics, more particularly amplifying characteristics, switching characteristics, etc. of transistors, can be improved by lowering the collector resistance.

In the foregoing embodiments, the above-mentioned objects of the present invention can be more effectively attained.

Figure 15:
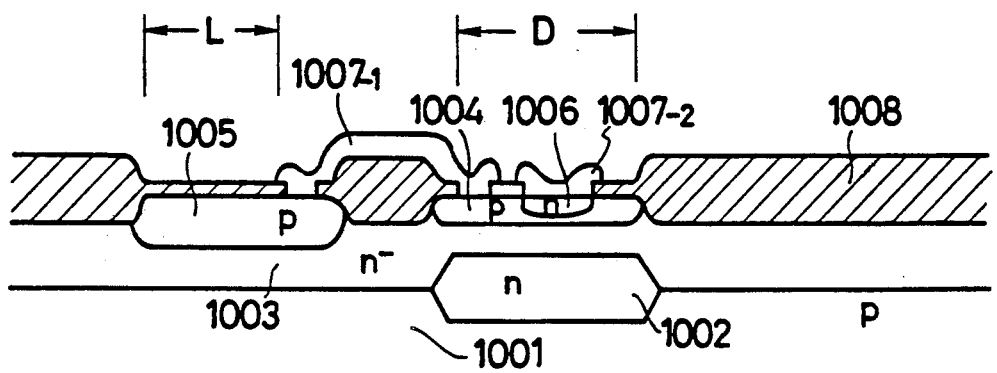
FIG. 15 is a schematic cross-sectional view explaining a photoelectric converter according to a sixth embodiment of the present invention.

FIG. 15 is a schematic cross-sectional view explaining a photoelectric converter according is a sixth embodiment of the present invention. This embodiment relates to a photoelectric converter with a photodiode anode and a bipolar transistor base region prepared by separate steps.

In FIG. 15, numeral 1001 is a p-type substrate; 1002 is a n-type embedded layer as a bipolar transistor collector; 1003 is an n− pitaxial layer; 1004 is a p layer of a bipolar transistor base region as an amplifying part; 1005 is a p layer of photodiode anode as a photoelectric conversion part; 1006 is an n layer as a bipolar transistor emitter region; 1007-1 is a wiring made of an electroconductive material such as Al, etc. to connect the p layer 1005 of photodiode anode to the p layer 1004 of bipolar transistor base region; 1007-2 is an emitter electrode made of an electroconductive material such as Al. polysilicon, etc.; 1008 is a LOCOS oxide film; L shows a light-receiving section; and D shows a light-shielding section.

As shown in FIG. 15, the photodiode provided in the light-receiving section and the bipolar transistor provided in the light-shielding section are connected to each other through the wiring 1007-1 and the light-receiving section and the light-shielding section can be provided separate from each other at a predetermined distance.

Figure 2:
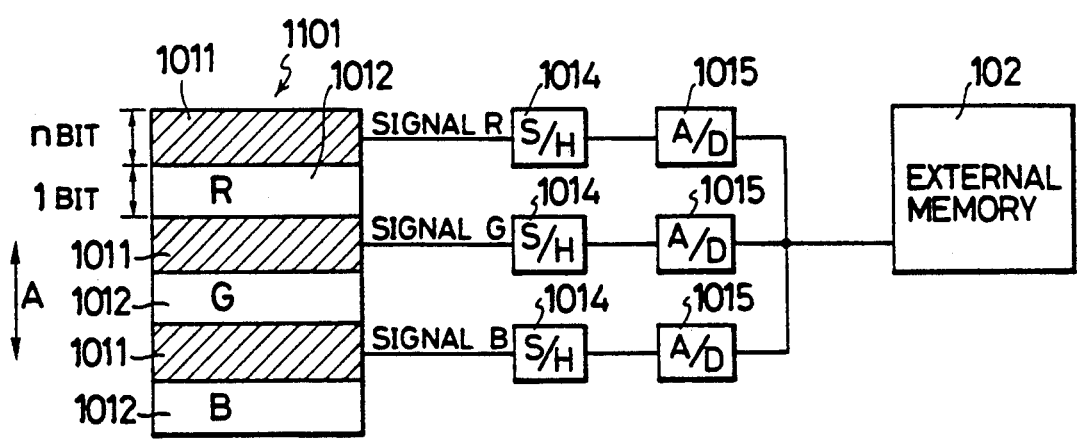
FIG. 2 is a schematic structural view explaining an image reading system using a conventional photoelectric converter.
Figure 17:
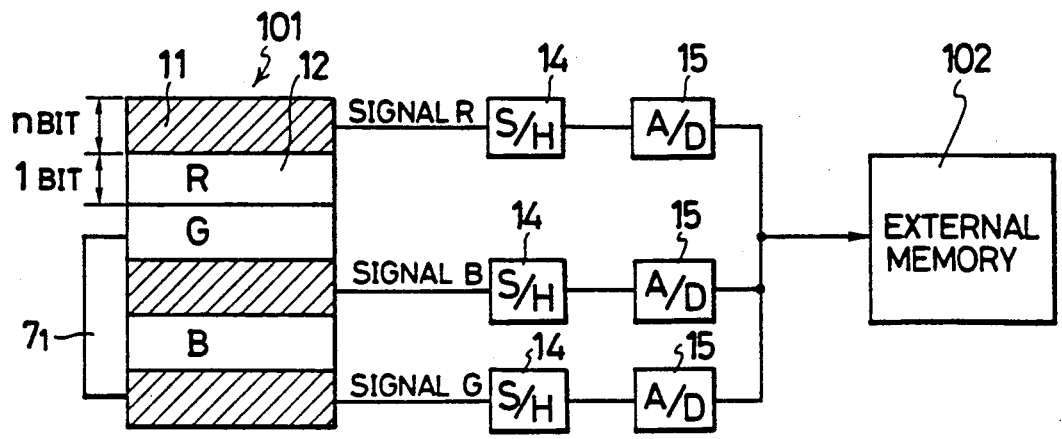
FIG. 17 is a schematic structural view explaining a picture reading system used in the present photoelectric converter.

When the present photoelectric converter is used as a color line sensor, the light-shielding section of a green line sensor can be provided outside a blue (or red) line sensor among line sensors for red (R), green (G) and blue (B), as shown in FIG. 17, and the light-receiving section for red and the light-receiving section for green can be provided adjacent to each other. Thus, at the time of obtaining an R signal in a given line of a draft, a G signal is a signal at a position of the draft in the 2nd line from the given line and a B signal is a signal at a position of the draft in the (n+3)th line from the given line, and thus the quantity of previously output G and B signals to be memorized is smaller than that by the color line sensor as shown in FIG. 2, and the capacity of the external memory can be made much smaller.

In this embodiment, the p layer 1004 of a bipolar transistor base region and the p layer 1005 of a photodiode anode are independently controlled with respect to the impurity diffusion, and the size of diffused region, impurity concentration, etc. can be independently controlled. Thus, the spectrosensitivity characteristics of photodiode can be adjusted to a desired wavelength sensitivity and also characteristics of bipolar transistor such as a amplification ratio, response speed, etc. can be set to desired optimum values.

Figure 16:
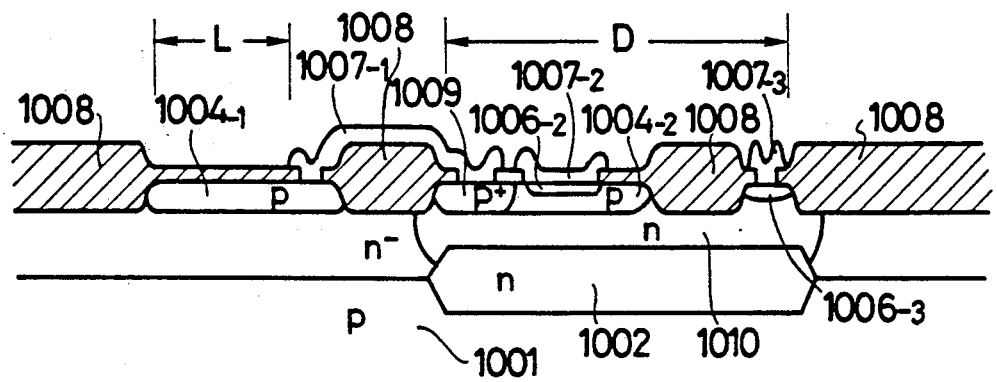
FIG. 16 is a schematic cross-sectional view explaining a photoelectric converter according to a seventh embodiment of the present invention.

FIG. 16 is a schematic cross-sectional view explaining a photoelectric converter according to a seventh embodiment of the present invention, where a p+ region is formed in the bipolar transistor and a collector region of bipolar transistor is provided separately, and the same constituent members as in the sixth embodiment are identified with the same reference numerals and symbols and their explanation is omitted.

In FIG. 16, numeral $1004_{-1}$ is a p layer of a photodiode anode and $1004_{-2}$ is a p layer of a bipolar transistor base region, and they are prepared at the same time. Numeral $1006_{-2}$ is an n layer of a bipolar transistor emitter region and 1009 is a p+ layer, provided with a high impurity concentration region to improve the frequency characteristics. Numeral 1010 is an n layer of bipolar transistor collector region, $1006_{-3}$ is an n+-layer and $1007_{-3}$ is a collector electrode made of an electroconductive material such as Al, polysilicon, etc.

As shown in FIG. 16, the photodiode provided in the separately formed light-receiving section and the bipolar transistor provided in the light-shielding section are connected to each other through a wiring $1007_{-1}$ to attain the same effect as in the sixth embodiment and also to make a color line sensor as shown in FIG. 17.

An example of a picture reading apparatus using the present photoelectric converter will be given below.

Figure 18:
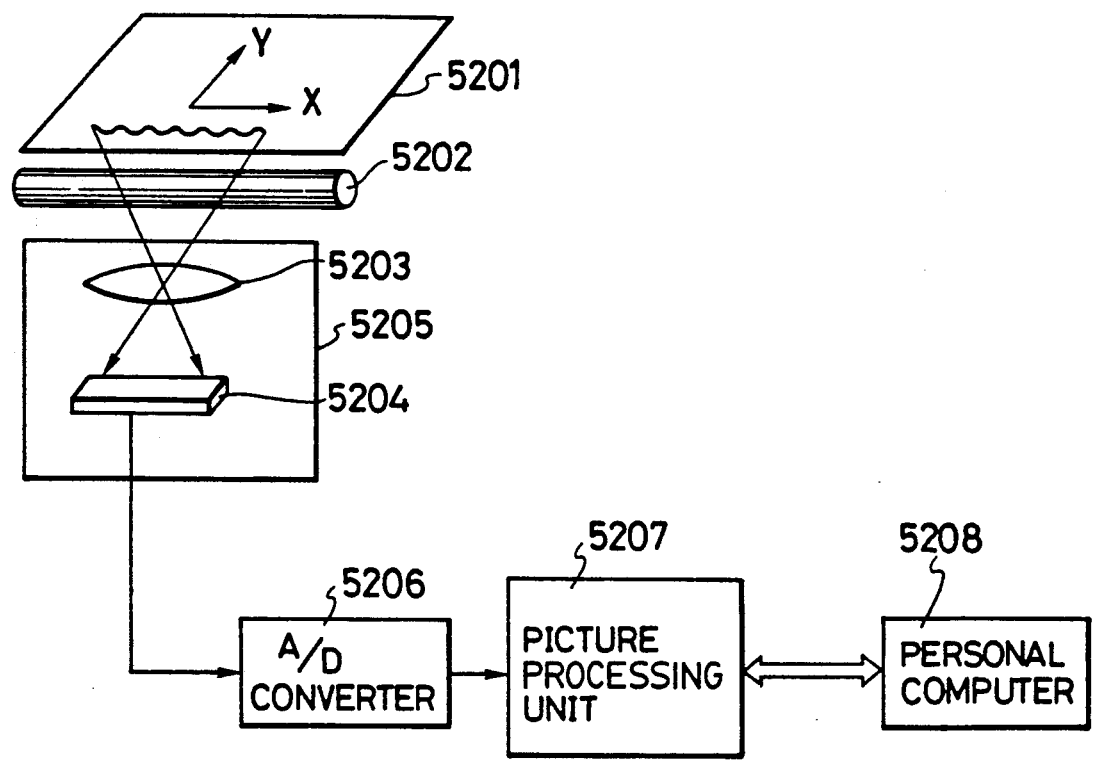
FIG. 18 is a schematic structural view explaining one example of a picture reading apparatus.

FIG. 18 is a schematic structural view explaining one example of a picture reading apparatus, where a draft 5201 is mechanically moved in the arrow-marked Y direction relative to a reading member 5205 and reading of a picture is carried out by an image sensor 5204 through scanning in the arrow-marked X direction.

At first, a light from a light source 5202 is reflected on the draft 5201 and the reflected light passes through an image-forming optical system 5203 to form an image on an image sensor 5204 as the present photoelectric converter. Then, carriers corresponding to the intensity of input light are accumulated in the image sensor 5204 and photoelectrically converted and output as an image signal. The image signal is subjected to a digital conversion in an AD converter 5206 and input into the memory in a picture processing unit 5207 as image data. After treatments such as shading correction, color correction, etc., the image data are transmitted to a personal computer 5208, a printer, etc.

After the completion of image signal transmission based on the scanning in the X direction, the draft 5201 is moved relative to the Y direction, and the same operations as in the foregoing operations are repeated, whereby the entire picture on the draft 5201 can be converted to electrical signals to output picture information.

As explained in detail above, the present photoelectric converter can have an amplifying function and the light-receiving section and the light-shielding section can be provided separate from each other and the light-receiving sections can be provided adjacent to each other. Thus, in the present invention, system design and optical design can be simplified.

Furthermore, in the present photoelectric converter, the input region of the amplifying part can be provided independent from the photoelectric conversion part, and the size, impurity concentration, structure, etc. of diffusion region can be independently controlled to adapt the spectrosensitivity characteristics of the photoelectric conversion part to a desired wavelength sensitivity and also to set characteristics of the amplifying part such as amplification ratio, response speed, etc. to desired optimum values. Thus, a device with desired properties can be designed.

Furthermore, in the present photoelectric converter, the optimum preparation conditions such as an impurity concentration, thickness, etc. of a semiconductor region for accumulating the charge generated by light input and the optimum conditions such as an impurity concentration, impurity concentration distribution, thickness, etc. of a semiconductor region that acts as a semiconductor transistor control electrode region can be selected as desired in the respective semiconductor regions. Thus, the light-receiving section and the semiconductor transistor section can be separately designed to enhance blue color sensitivity and attain a higher speed semiconductor transistor response.

We claim:

1. A photoelectric converter of a bipolar transistor, comprising two regions of a same electroconductive type, wherein one of the two regions of the same electroconductive type is an emitter region of the transistor and the other region of the same electroconductive type is a collector region of the transistor, said transistor further comprises a base region of an electroconductive type opposite that of said two regions of the same electroconductive type, the semiconductor region of opposite electroconductive type is irradiated by a light, and an output is derived from at least one of the two semiconductor regions of the same electroconductive type, wherein said semiconductor region of the opposite electroconductive type is divided into a semiconductor region for storing charge generated by the light, and a semiconductor region that is a control electrode region of the bipolar transistor, and wherein said semiconductor region of the opposite electroconductive type for storing charge has an impurity concentration lower than that of said control electrode region.

2. A photoelectric converter comprising a plurality of photoreceiving sections and a plurality of light shielding sections, wherein a photoelectric conversion section is provided on said photoreceiving section, an amplifying section is provided on said light shielding section for amplifying an output from the photoelectric conversion section, the photoelectric conversion section and an input into said amplifying section are connected via a wiring, at least one of said light shielding sections is separated by a predetermined distance from said photoreceiving section, and at least two of said photoreceiving sections are in an adjacent substantially relationship with each other.

3. A photoelectric converter which comprises a first semiconductor region of a first electroconductive type, a second semiconductor region of the first electroconductive type provided on the first semiconductor region, a third semiconductor region of a second electroconductive type provided in contact with the second semiconductor region, a fourth semiconductor region of the second electroconductive type provided in contact with the third semiconductor region and the second semiconductor region, a fifth semiconductor region of the first electroconductive type provided in contact with the fourth semiconductor region, and a sixth semiconductor region of the second electroconductive type provided in contact with the second semiconductor region, the third semiconductor region being a light input region and the first, second, fourth and fifth semiconductor regions and the second, fourth and sixth semiconductor regions being elements of transistors, respectively, wherein said third semiconductor region has an impurity concentration lower than that of said fourth semiconductor region.

4. A photoelectric converter according to claim 3, wherein the second semiconductor region comprises regions of a same electroconductive type and different impurity concentrations including a region of low impurity concentration and a region of high impurity concentration.

5. A photoelectric converter according to claim 3, wherein the second semiconductor region comprises regions of a same electroconductive type and different impurity concentration including a region of low impurity concentration and a region of high impurity concentration, and the region of high impurity concentration is provided between the fourth, fifth and sixth semiconductor regions and the first semiconductor region.

6. A photoelectric converter according to claim 3, wherein at least a part of the third semiconductor region is provided between the fourth semiconductor region and the second semiconductor region.

7. A photoelectric converter according to claim 3, wherein the second semiconductor region comprises regions of a same electroconductive type and different impurity concentrations including a region of low impurity concentration and a region of high impurity concentration, the region of high impurity concentration is provided between the fourth, fifth and sixth semiconductor regions and the first semiconductor region, and at least a part of the third semiconductor region is provided between the fourth semiconductor region and the second semiconductor region.

8. A photoelectric converter according to claim 7, wherein the third semiconductor region is provided between the fourth semiconductor region and the region of high impurity concentration.

9. A photoelectric converter according to claim 3, wherein the first semiconductor region is provided except for a region corresponding to at least the third semiconductor region.

10. A photoelectric converter according to claim 3, wherein the first semiconductor region is provided on a substrate of the same electroconductive type.

11. A photoelectric converter according to claim 3, wherein the first semiconductor region is provided on a substrate of a different conductivity type from the first semiconductor region.

12. A photoelectric converter according to claim 3, wherein the first electroconductive type is n-type.

13. A photoelectric converter according to claim 3, wherein the second electroconductive type is p-type.

14. A photoelectric converter according to claim 11, wherein the different electroconductive type is p-type.

15. A photoelectric converter according to claim 3, wherein a seventh semiconductor region of the first electroconductive type acting as a channel stop surrounding a region wherein the third, fourth, fifth and sixth semiconductor regions are provided is provided on a surface part of the second semiconductor region.

16. A photoelectric converter which comprises a first semiconductor region of a first electroconductive type, a second semiconductor region of the first electroconductive type provided in contact with the first semiconductor region, a third semiconductor region of a second electroconductive type provided in contact with the second semiconductor region, a fourth semiconductor region of the second electroconductive type electrically connected to the third semiconductor region through an electroconductive material and provided in contact with the second semiconductor region and a fifth semiconductor region of the first electroconductive type provided in contact with the fourth semiconductor region, the third semiconductor region being a light input region and the first, second, fourth and fifth semiconductor regions are elements of a transistor.

17. A photoelectric converter according to claim 16, wherein the second semiconductor region comprises regions of a same electroconductive type and of different impurity concentrations including a region of low impurity concentration and a region of high impurity concentration.

18. A photoelectric converter according to claim 16, wherein the second semiconductor region comprises regions of a same electroconductive type and different impurity concentrations including a region of low impurity concentration and a region of high impurity concentration, and the region of low impurity concentration is in contact with the third semiconductor region.

19. A photoelectric converter according to claim 18, wherein the region of high impurity concentration is electrically connected to an electrode.

20. A photoelectric converter according to claim 2, wherein said input into said amplifying section to which the wiring from said photoelectric conversion section is connected comprises regions of a same electroconductive type, and of at least different impurity concentrations.

21. A photoelectric converter according to claim 20, wherein a higher impurity concentration region among said different impurity concentration regions constituting the imput into the amplifying section is connected via the wiring to said photoelectric conversion section.

* * * * *

UNITED STATES PATENT AND TRADEMARK OFFICE
CERTIFICATE OF CORRECTION

PATENT NO. : 5,245,203
DATED : September 14, 1993
INVENTOR(S) : MASAKAZU MORISHITA ET AL.   Page 1 of 3

It is certified that error appears in the above-indentified patent and that said Letters Patent is hereby corrected as shown below:

<u>TITLE PAGE, ITEM [56], REFERENCES CITED</u>

U.S. Patent Documents, "4,737,832 4/1989 Kyuma" should read --4,737,832 4/1988 Kyuma--.

<u>IN THE DRAWINGS</u>

<u>SHEET 1 OF 15</u>

Figure 3A:
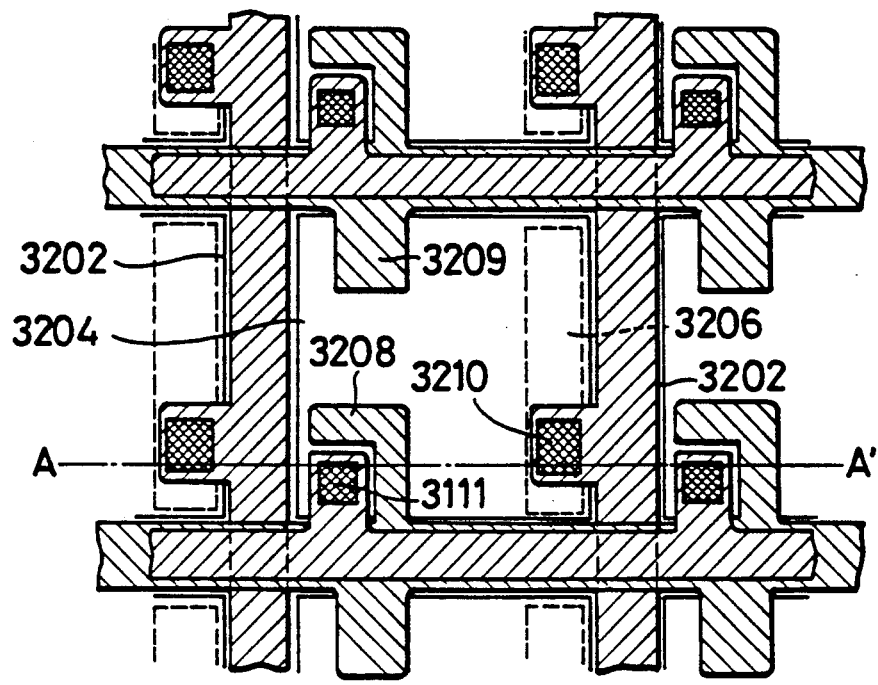
FIG. 3A is a schematic plan view of the structure of a conventional photoelectric converter and FIG. 3B is a schematic cross-sectional view along the line A—A' of FIG. 3A.
Figure 3B:
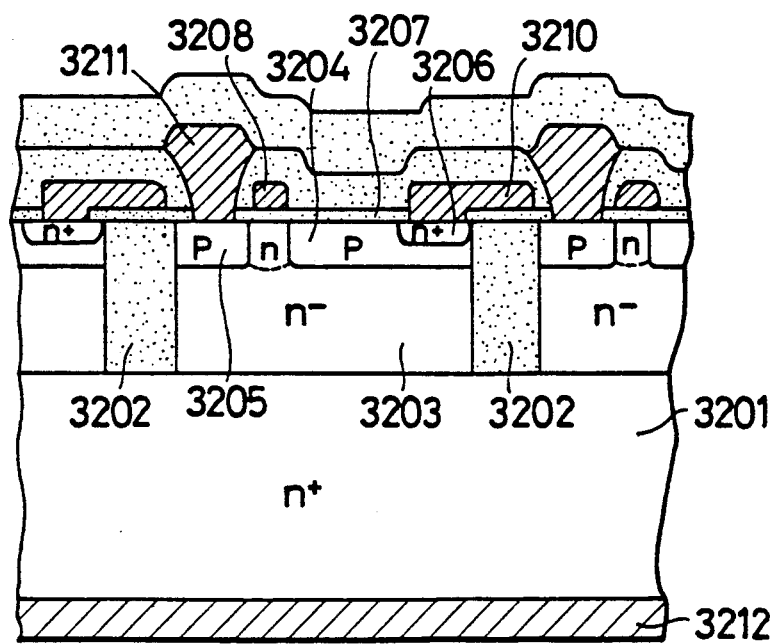
Figure 4A:
FIGS. 4A and 4B show potential wave forms for explaining a conventional refresh operation, respectively.
Figure 4B:
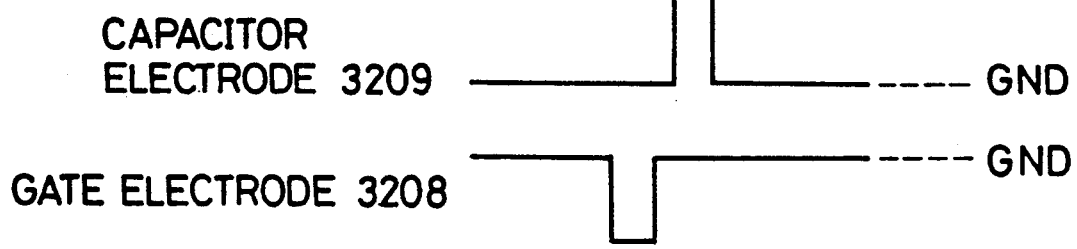

FIG. 1, "FIG. 1" should read --FIG. 1 PRIOR ART--.
FIG. 2, "FIG. 2" should read --FIG. 2 PRIOR ART--.
FIG. 3A, "FIG. 3A" should read --FIG. 3A PRIOR ART--.
FIG. 3B, "FIG. 3B" should read --FIG. 3B PRIOR ART--.

<u>COLUMN 1</u>

Line 28, "accumulates," should read --accumulates--.
Line 31, "converters" should read --converter available--.
Line 34, "converters" should read --converter--.
Line 49, "functioning," should be deleted.
Line 50, "p layer" should read --p layer functioning--.

<u>COLUMN 2</u>

Line 4, "R, G and R" should read --R, G and B--.

UNITED STATES PATENT AND TRADEMARK OFFICE
CERTIFICATE OF CORRECTION

PATENT NO. : 5,245,203
DATED : September 14, 1993
INVENTOR(S) : MASAKAZU MORISHITA ET AL.    Page 2 of 3

It is certified that error appears in the above-indentified patent and that said Letters Patent is hereby corrected as shown below:

COLUMN 3

Line 62, "of" should read --of a--.

COLUMN 4

Line 37, "to" should read --to be--.

COLUMN 6

Line 56, "view" should be deleted.
Line 57, "along the" should be deleted.
Line 62, italics should be deleted.
Line 64, "region 4" should read --region-- and "region." should read --region 4.--.
Line 66, "thickness" should read --thickness is--.

COLUMN 7

Line 15, "in" (second occurrence) should read --is--.

COLUMN 8

Line 4, "inks" should read --into--.
Line 23, "shows" should read --show--.

COLUMN 9

Line 59, "pitaxial" should read --epitaxial--.

UNITED STATES PATENT AND TRADEMARK OFFICE
CERTIFICATE OF CORRECTION

PATENT NO. : 5,245,203
DATED : September 14, 1993
INVENTOR(S) : MASAKAZU MORISHITA ET AL.

It is certified that error appears in the above-indentified patent and that said Letters Patent is hereby corrected as shown below:

<u>COLUMN 12</u>

Line 16, "substantially" should be deleted.
    Line 49, "concentration" should read --concentrations--.

<u>COLUMN 14</u>

Line 34, "imput" should read --input--.

Signed and Sealed this

Twenty-third Day of August, 1994

Attest:

BRUCE LEHMAN

*Attesting Officer*       *Commissioner of Patents and Trademarks*